(12) United States Patent
Passamani

(10) Patent No.: US 12,640,750 B2
(45) Date of Patent: May 26, 2026

(54) DIGITAL-TO-ANALOG CONVERTER CLOCK TRACKING SYSTEMS AND METHODS

(71) Applicant: Apple Inc., Cupertino, CA (US)

(72) Inventor: Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 536 days.

(21) Appl. No.: 17/840,309

(22) Filed: Jun. 14, 2022

(65) Prior Publication Data

US 2023/0403025 A1    Dec. 14, 2023

(51) Int. Cl.
H03M 1/66        (2006.01)
H03M 1/76        (2006.01)
(52) U.S. Cl.
CPC ........... H03M 1/661 (2013.01); H03M 1/765 (2013.01)
(58) Field of Classification Search
CPC ........ H03M 1/747; H03M 1/662; H03M 1/66; H03M 1/74; H03M 1/0624; H03M 1/682; H03M 1/0626; H03M 3/502; H03M 1/76; H03M 1/46; H03M 3/47; H03M 3/50
USPC ....................................... 341/141, 144, 153
See application file for complete search history.

(56) References Cited

U.S. PATENT DOCUMENTS 4,727,355 A * 2/1988 Kohdaka ................. H03M 1/68
                                                        341/138
5,014,054 A * 5/1991 Oshita ................... H03M 1/682
                                                        341/145

5,170,158 A * 12/1992 Shinya ................. G09G 3/2011
                                                        345/98
5,566,124 A * 10/1996 Fudeyasu ............. G11C 7/1075
                                                        365/230.09
5,684,482 A * 11/1997 Galton ................ H03M 1/0668
                                                        341/144

(Continued)

FOREIGN PATENT DOCUMENTS

CN          111245439 A      6/2020

OTHER PUBLICATIONS

Andersson, N.U., et al.; "A strategy for implementing Dynamic Element Matching in Current-Steering DACs", ISCAS '99, Proceeding of the 1999 IEEE International Symposium on Circuits and Systems, vol. 2, Feb. 27, 2000; pp. 51-56 (XP000991231).

(Continued)

*Primary Examiner* — Linh V Nguyen
(74) *Attorney, Agent, or Firm* — FLETCHER YODER PC

(57)          ABSTRACT
A number of unit cells of a digital-to-analog converter (DAC) may be simultaneously activated to generate an analog signal according to a decoded digital signal. Latches may be used at one or more levels of decoding and may be activated according to a clock signal to recapture the at least partially decoded data signals to maintain/improve the synchronicity of activation of the unit cells. However, the latches may consume additional power during operation. As such, clock tracking techniques such as static clock tracking, dynamic clock tracking, or differential clock tracking may be utilized to generate a clock path activation signal that gates the clock signal and determines which latches to ignore (e.g., leave inactive). In this manner, instead of activating each latch for every digital signal, clock tracking may be implemented to deactivate latches that do not provide useful updates to the decoded digital signal received at the unit cells.

20 Claims, 11 Drawing Sheets

(56)     References Cited

U.S. PATENT DOCUMENTS

| | | | | |
|---|---|---|---|---|
| 5,784,327 | A * | 7/1998 | Hazani ............. | G11C 29/50004 |
| | | | | 365/230.01 |
| 5,959,900 | A * | 9/1999 | Matsubara ........... | G11C 7/1072 |
| | | | | 365/194 |
| 7,054,218 | B2 * | 5/2006 | Gu ........................... | G11C 8/10 |
| | | | | 365/230.09 |
| 7,797,595 | B2 * | 9/2010 | Cooke .................. | G11C 29/024 |
| | | | | 714/719 |
| 10,715,170 | B1 | 7/2020 | Bonen | |
| 10,938,405 | B1 * | 3/2021 | Honarparvar ......... | H03M 1/661 |
| 2022/0094368 | A1 | 3/2022 | Passamani | |

OTHER PUBLICATIONS

Extended European Search Report for European Patent Application No. 23175331.0 dated Nov. 9, 2023.

* cited by examiner

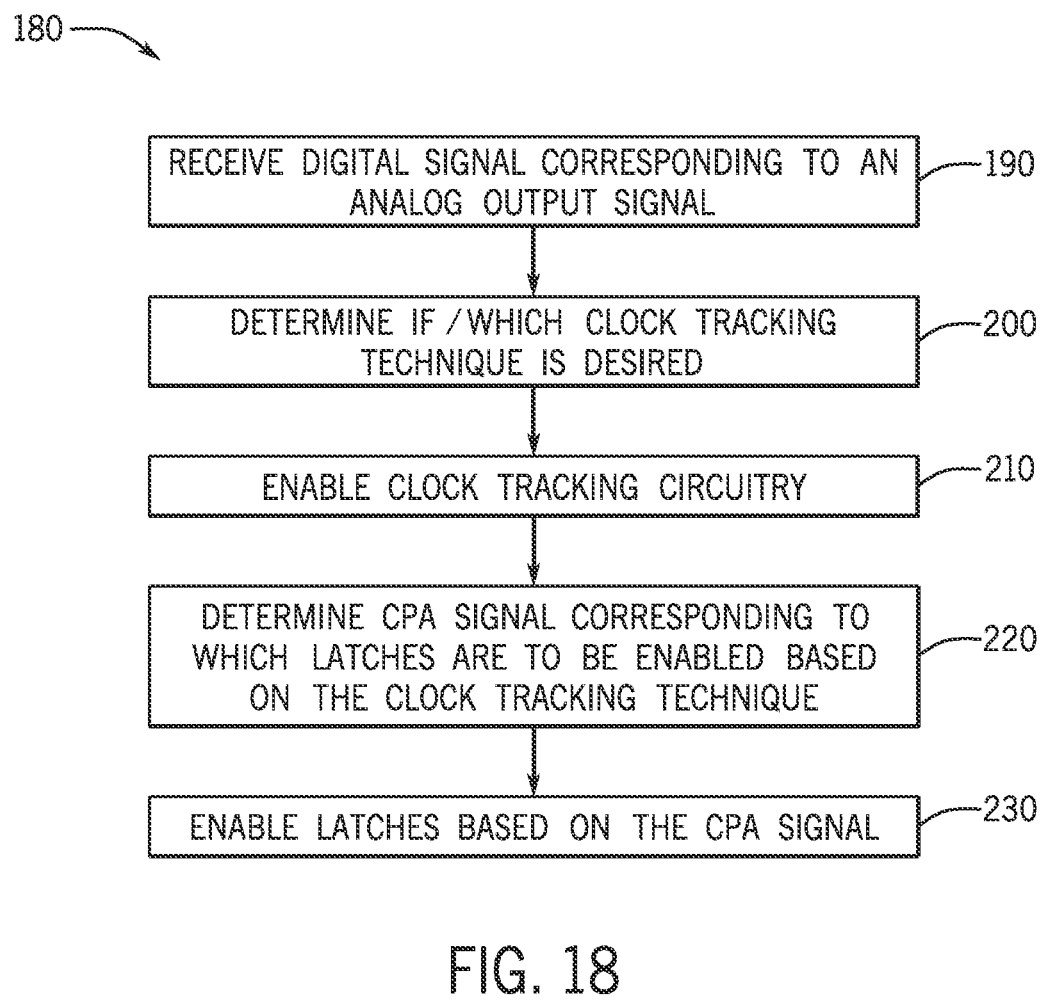

180 —↘

RECEIVE DIGITAL SIGNAL CORRESPONDING TO AN
ANALOG OUTPUT SIGNAL —190

DETERMINE IF / WHICH CLOCK TRACKING
TECHNIQUE IS DESIRED —200

ENABLE CLOCK TRACKING CIRCUITRY —210

DETERMINE CPA SIGNAL CORRESPONDING TO
WHICH LATCHES ARE TO BE ENABLED BASED
ON THE CLOCK TRACKING TECHNIQUE —220

ENABLE LATCHES BASED ON THE CPA SIGNAL —230

FIG. 18

DIGITAL-TO-ANALOG CONVERTER CLOCK TRACKING SYSTEMS AND METHODS

BACKGROUND

This disclosure generally relates to digital-to-analog converters (DACs) and clock tracking.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages based on digitally coded image data to produce the specific luminance level outputs to display an image. In some scenarios, a DAC may use one or more unit cells that, in the aggregate, form an analog output voltage. Moreover, a clock signal may trigger components of the DAC to assist in synchronous operations. However, providing the clock signal to the different components leading to unit cells not currently in use may draw additional power and decrease efficiency.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a digital-to-analog converter (DAC) may include a unit cell array having multiple unit cells and a branching data path coupled to the unit cells. Additionally, the DAC may include latches disposed on a plurality of branches of a level of the branching data path, and the latches may latch bits of a digital signal propagated via the branching data path.

In another embodiment, an electronic device may include a digital-to-analog converter (DAC) having multiple cells and a data path to decode and communicate a digital signal to the cells. The data path may include multiple latches operatively enabled based on a clock path activation signal. Additionally, the electronic device may include clock tracking circuitry to generate the clock path activation signal based on the digital signal.

In yet another embodiment, a method may include receiving, at a digital-to-analog converter (DAC), a digital signal corresponding to an analog output of the DAC, wherein the DAC includes multiple cells to generate the analog output. The method may also include determining, via clock tracking circuitry, a clock path activation signal based on the digital signal and enabling one or more latches of the DAC based on the clock path activation signal. Moreover, the latches may latch at least a portion of the digital signal along a data path to the plurality of cells.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 18 is a flowchart of an example process for clock tracking, in accordance with an embodiment of the present disclosure.

DETAILED DESCRIPTION OF SPECIFIC EMBODIMENTS

Figure 1:
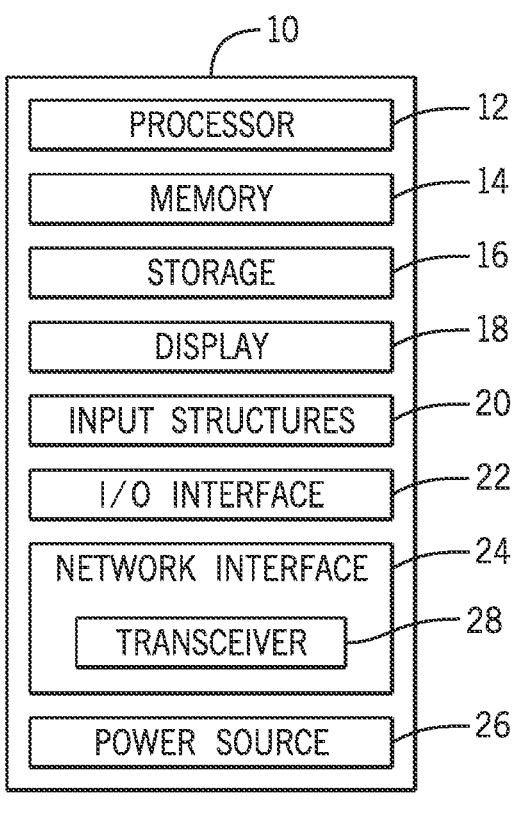
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

An electronic device may use one or more digital-to-analog converters (DACs) to convert digitally coded data (e.g., coded via binary code, grey-code, thermometer code, etc.) to a corresponding analog output voltage. For example, the electronic device may transmit and receive radio frequency (RF) signals to communicate with other electronic devices. In general, DACs may generate an analog electrical signal to be transmitted by switching on one or more unit cells to output one or more unit level currents or voltages that, in the aggregate, forms the analog electrical signal. In some scenarios, the physical and/or logical layout of the unit cells may alter the data path length to each unit cell and/or the number of circuitry components traversed by the digital signal, which may affect speed of operation of the DAC and/or linearity of the DAC. For example, a column and line DAC may use parallel control circuitry to decipher, reprocess, and/or combine digital data to control operation of unit cells to generate an analog signal. However, the logical layout of the column and line control circuitry, as well as the physical layout of the column and line unit cells, may create varying data path lengths to the unit cells, as well as more complicated and/or slower control logic operation, than that of a fractal DAC. This may lead to phase delays and/or synchronicity issues when compared to the fractal DAC.

In some embodiments, a fractal arrangement of unit cells and/or the transmission lines thereto in branches (e.g., as may be implemented in the fractal DAC) may assist in homogenizing the data path length to each of the unit cells, which may result in increased speed (e.g., operating frequency) of the DAC, increased linearity, better synchronous performance, and/or potential power savings. For example, as opposed to column and line DACs, where the data path to different unit cells may vary, a fractal DAC may have a static (e.g., same or similar) path length for the incoming data to each of the unit cells. In other words, each branch of the fractal layout tree may have equal length from the input to the unit cells. As such, there is reduced or minimized waiting between moments when activation signals arrive at the unit cells to be activated for a given data value. Additionally, simplified distribution (e.g., via sequential decision units) of the incoming data to the unit cells may be further or alternatively simplified by reducing gate cells and/or reprocessing or recombining the data signals, which may further increase speed capabilities (e.g., operating frequency) and/or linearity (e.g., decreased differential nonlinearity (DNL) and/or integral nonlinearity (INL)) of the DAC. In some embodiments, the decision units may be disposed at branch points of the fractal DAC and facilitate decoding a digital signal into the thermometer coded data for the unit cells. Moreover, due to the sequential nature of the decision units governing the unit cells, some signals (e.g., a clock signal, a phase signal, etc.) may be turned off when it is known that no further unit cells will be needed in a particular branch yielding increased power savings.

During operation, a number of unit cells corresponding to the input digital signal may be activated (e.g., simultaneously or concurrently) to generate the analog signal. While the layout of the fractal DAC may improve linearity and synchronicity, in some embodiments, latches may be used at one or more levels of decoding (e.g., at one or more branch points of decision units) for data synchronization. The latches (e.g., flip-flops, registers) may be activated according to a clock signal to recapture the at least partially decoded data signals to maintain and/or improve the synchronicity of activation of the unit cells. However, using latches for synchronicity may result in additional power consumption. Furthermore, it is noted that, as the decoding path (e.g., data path along the branches of the fractal DAC) splits into more branches at each level of decision units, if utilized at further levels, the number of latches (corresponding to the number of data lines) also increases (e.g., at an exponential rate), which may further increase power consumption. As such, in some embodiments, clock tracking techniques may be utilized to determine which latches may be ignored (e.g., not activated) based on the input digital signal.

In this manner, instead of activating each latch for every input digital signal, static clock tracking, dynamic clock tracking, or differential clock tracking may be implemented (e.g., via clock tracking circuitry) to deactivate latches that do not provide changes to the thermometric code received at the unit cells. For example, static clock tracking may reduce the number of active latches based on a known (e.g., determined or estimated) static maximum of the desired analog output signal and/or corresponding input digital signal. The static maximum may be a determined or estimated value representative of the highest input digital signal that will be requested to be converted to a corresponding analog output signal over a foreseeable future (e.g., future time period, during a current mode of operation, for a known number of upcoming conversions, etc.). Moreover, the static maximum may be less than or equal to the maximum analog output of the DAC (e.g., based on the capabilities of the DAC). If the static maximum is less than the maximum allowed digital signal, the portion of the latches and/or decoding circuitry corresponding to the unit cells not utilized in generating the analog output signal may be deactivated, leading to significant power savings.

Further, in some embodiments, the input digital signal may be dynamically tracked such that the latches may be activated and deactivated on-the-fly (e.g., during runtime of the DAC) according the input digital signal. As such, latches associated with active unit cells and/or unit cells changing from active states to inactive states (or vice versa) may be activated, while those of inactive unit cells may be deactivated one or more cycles ahead of receiving the digital signal. Furthermore, in some embodiments, differential clock tracking may be utilized to activate latches corresponding to portions of the digital signal that are changing from a previous digital signal while deactivating latches corresponding to portions of the digital signal that are unchanged from the previous digital signal.

Additionally, in some embodiments, clock tracking may be selectively turned on or off and/or the type of clock tracking may be selected depending on a current implementation. For example, in some scenarios, activating/deactivating latches may introduce noise in the digital signal and/or analog output voltage. As such, the different types of clock tracking discussed herein may provide different levels of, and thus balance between, power savings and noise.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11x family of protocols (e.g., WI-FI®), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-300 gigahertz (GHz)) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
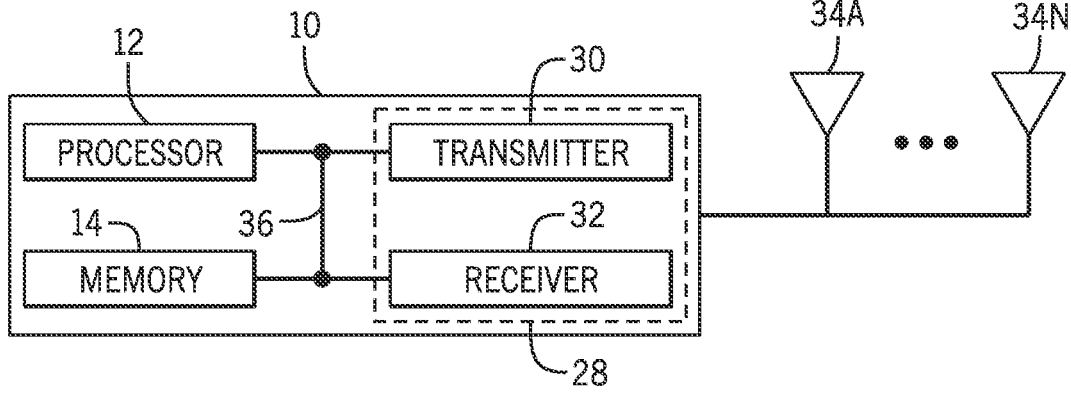
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with a one or more beams and various configurations. In some embodiments, multiple antennas of the antennas 34A-34N of an antenna group or module may be communicatively coupled a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
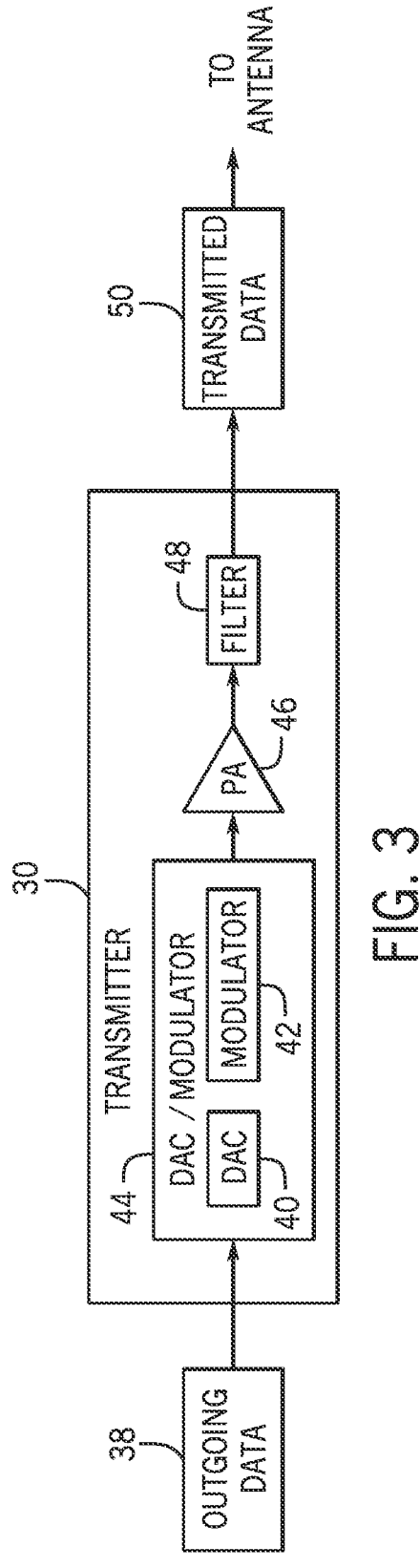
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. Additionally or alternatively, the DAC 40 and modulator 42 may be implemented together in a DAC/modulator 44. For example, the DAC/modulator 44 may convert the digital signal to the analog signal and combine the converted analog signal with the carrier signal simultaneously or concurrently and/or within the same circuitry. Moreover, the DAC/modulator 44 may be implemented as multiple circuits (e.g., DAC and modulator 42) coupled together or a singular combined circuit. In some embodiments, the DAC/modulator 44 may directly generate a modulated analog signal without first generating the converted analog signal. Furthermore, as used herein, a DAC 40 may refer to a standalone DAC or a combined DAC/modulator 44, and an analog signal may refer to a converted analog signal or a modulated analog signal. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate transmitted data 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components not shown, or may not include certain of the illustrated components, such that the transmitter 30 may transmit the outgoing data 38 via the one or more antennas 34. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
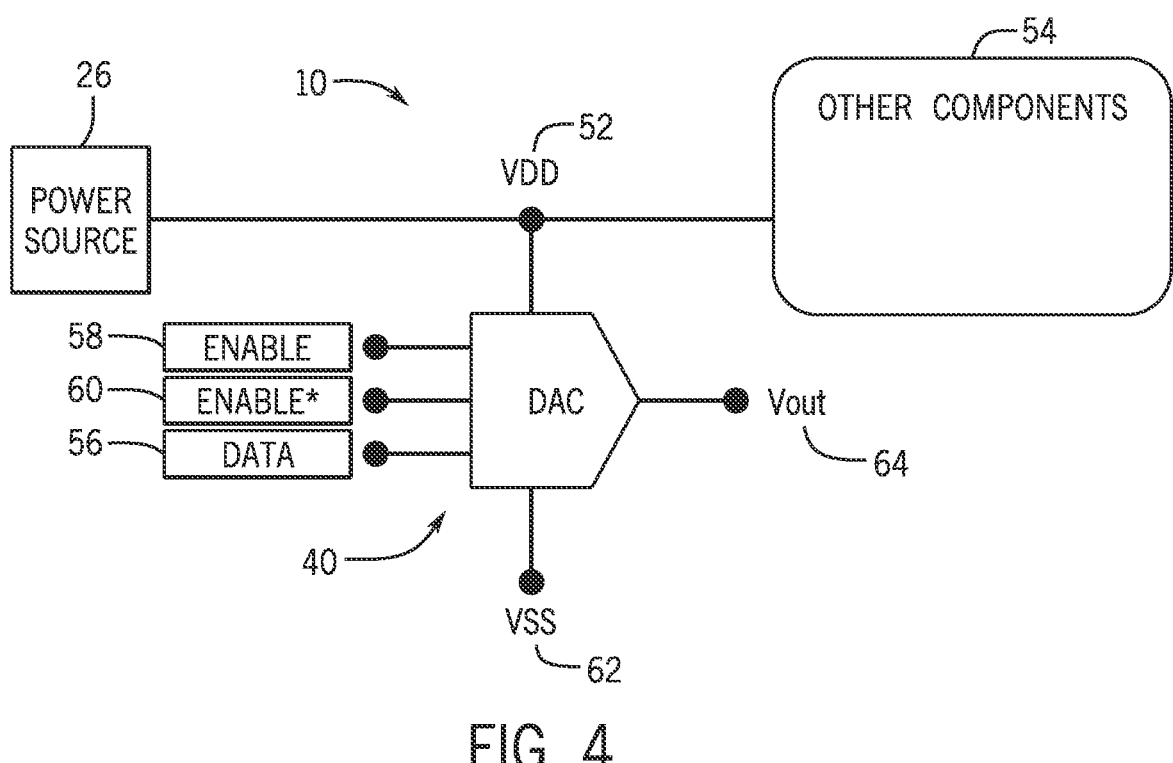
FIG. 4 is a schematic diagram of a portion of the electronic device of FIG. 1 including a digital-to-analog converter of the transmitter of FIG. 3, in accordance with an embodiment of the present disclosure.

FIG. 4 is a schematic diagram of a portion of the transmitter 30 of the electronic device 10 having a DAC 40, according to an embodiment of the present disclosure. In some embodiments, the DAC 40 may share a supply or positive power voltage (e.g., VDD) 52 provided by the power source 26 with other components 54 of the transmitter 30 and/or the electronic device 10. For example, the other components 54 may include any powered electronic component of the transmitter 30 and/or the electronic device 10 utilizing the supply voltage 52 or a derivative thereof. Moreover, the DAC 40 may receive a digital signal 56 (e.g., of outgoing data 38), an enable signal 58, and/or a complementary enable signal 60. The enable signal 58 and/or the complementary enable signal 60 may enable and/or facilitate enabling operation of the DAC 40. For example, if the enable signal 58 is logically "low" relative to a reference voltage 62 (e.g., ground or other relative voltage), then the DAC 40 may be disabled or inactive (e.g., in a disable, inactive, or deactivated state). On the other hand, if the enable signal 58 is logically "high" (e.g., relative to the reference voltage 62 and/or the supply voltage 52), then the DAC 40 may be enabled or active for operation (e.g., in an enabled or activated state). Furthermore, the reference voltage 62 (e.g., VSS) may be provided as a reference for the digital signal 56, the enable signal 58, the complementary enable signal 60, the supply voltage 52, and/or the analog output signal 64. As should be appreciated, and as used herein, signals (e.g., the digital signal 56, the enable signal 58, the complementary enable signal 60, the analog output signal 64, etc.) may correspond to voltages and/or currents relative to a reference and may represent electronically storable, displayable, and/or transmittable data.

As discussed herein, the different analog output signals 64 generated by the DAC 40 may correspond to values of the digital signal 56. The digital signal 56 and corresponding analog output signal 64 may be associated with any suitable bit-depth depending on implementation. For example, in the context of image data (e.g., in a baseband DAC) and/or signal transmission data (e.g., in an RF DAC), an 8-bit digital signal 56 may correspond to 255 or 256 analog output signals 64.

Figure 5:
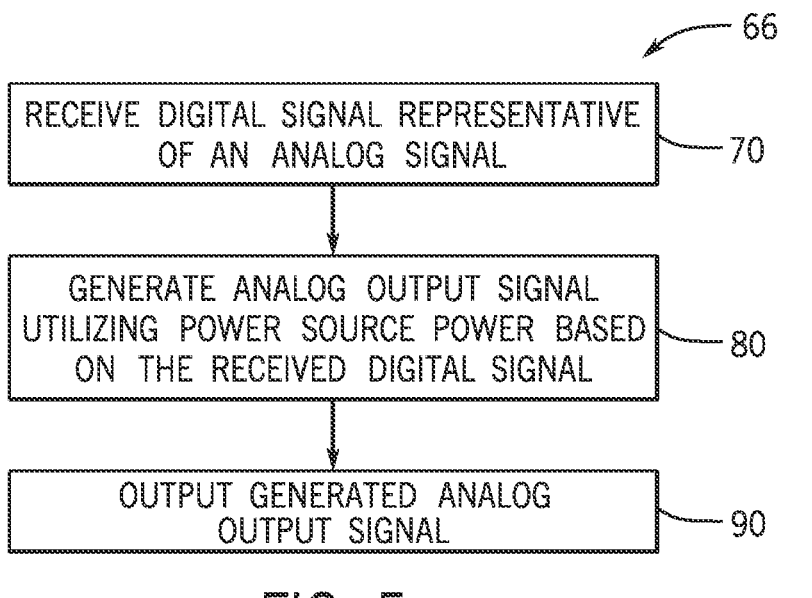
FIG. 5 is a flowchart of a method for converting a digital signal to an analog signal using the digital-to-analog converter of FIG. 4, in accordance with an embodiment of the present disclosure.

FIG. 5 is a flowchart of a method 66 for converting a digital signal to an analog signal using the DAC 40, according to an embodiment of the present disclosure. In general, the DAC may receive a digital signal 56 representative of an analog signal (process block 70). The DAC 40 may also generate an analog output signal 64 (as discussed in further detail below), utilizing power from the power source 26, based on the received digital signal 56 (process block 80). The generated analog output signal 64 may then be output from the DAC 40 (processing block 90).

Figure 6:
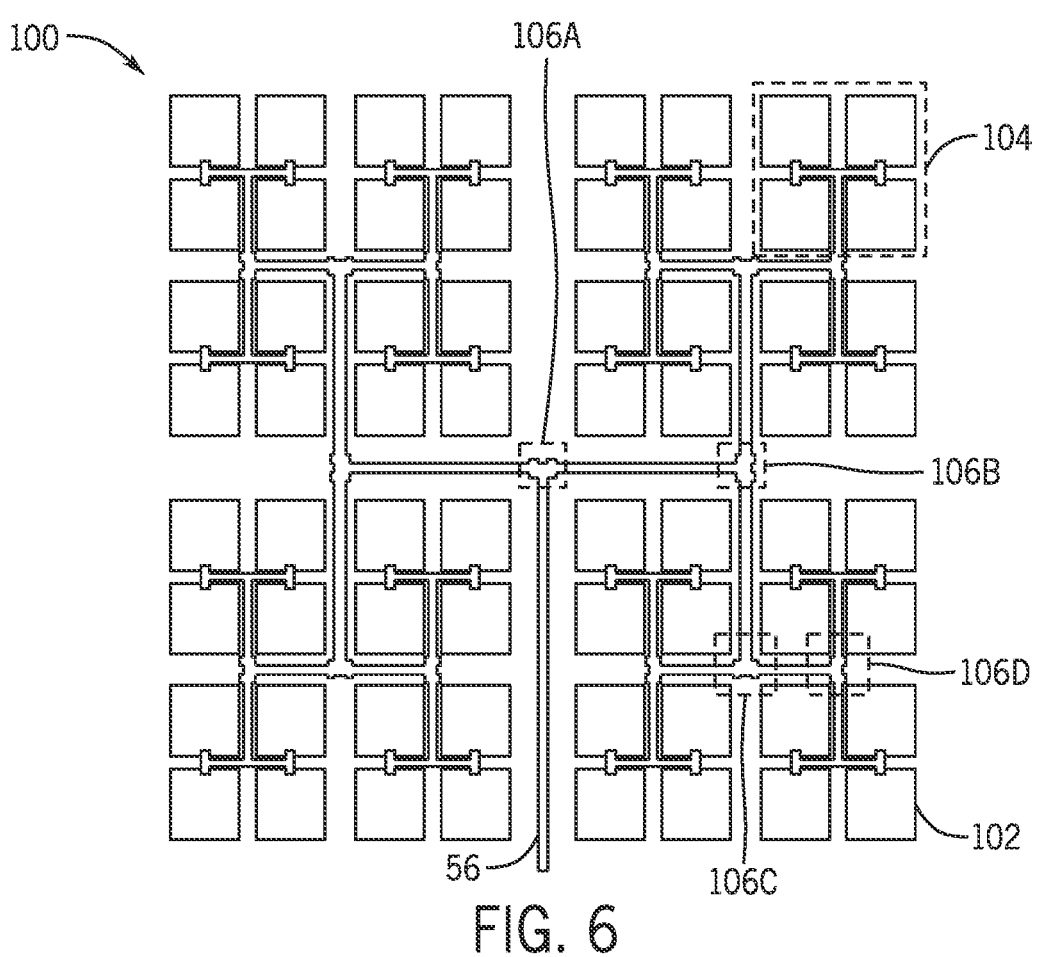
FIG. 6 is a schematic diagram of a fractal digital-to-analog converter, in accordance with an embodiment of the present disclosure.

As discussed above, the DAC 40 may generate an analog output signal 64 by enabling one or more unit cells to output a unit amount of current or voltage that, in the aggregate, form the analog output signal 64. The unit current or voltage may be predetermined and based on implementation factors. For example, the unit cells may include one or more capacitors that store a fixed amount of charge that may be released to form the analog output signal 64. In some scenarios, the physical and/or logical layout of the unit cells may affect the speed of operation of the DAC 40 and/or the linearity of the DAC 40. As such, in some embodiments, one or more DACs 40 of the electronic device 10 may be implemented as a fractal DAC 100, as illustrated in FIG. 6. A fractal DAC 100 may include multiple unit cells 102 arranged (e.g., logically and/or physically) in a fractal pattern constructed of fractal blocks 104. Moreover, the illustrated pattern may be replicated by replacing each unit cell 102 with a fractal block 104 to realize a fractal DAC of increased size while maintaining symmetry.

In the illustrated example, the fractal DAC 100 includes sixteen fractal blocks 104 of four unit cells 102, which may correspond to, for example, sixty-four different analog output signals 64 (e.g., which may have non-zero values). However, larger fractal DACs may be envisioned by replacing each unit cell 102 with a fractal block 104, increasing the size of the fractal DAC 100 by four each time to maintain $4^x$ unit cells 102 (where x is the number of fractal block recursions in the fractal DAC 100). As should be appreciated, the size of the fractal DAC 100 may depend on implementation factors such as desired granularity of the analog output signal 64. Furthermore, different size fractal blocks 104 (e.g., half of a fractal block 104) may be used to achieve different numbers of total unit cells 102 (e.g., $2^x$ number of unit cells 102 for fractal blocks 104 having a size of two unit cells 102). Moreover, in some embodiments, one or more unit cells 102 may be representative of fractional unit cells (e.g., outputting 0.5 or 0.25 of a unit voltage or current) to further increase granularity, dynamic range extension, and/or as an offset to decrease differential non-linearity (DNL) and/or integral nonlinearity (INL).

In some embodiments, the multiple nested fractal blocks 104 may be continuously/recursively split into symmetrical branches by decision units 106 (e.g., 106A, 106B, 106C, 106D, etc.) until reaching the unit cells 102. That is, for a given branch of the fractal DAC 100, sequential decision units 106 may be used to interpret and decode the digital signal 56 and direct enable/disable signals to the corresponding unit cells 102 to generate the analog output signal 64. Additionally, although the digital signal 56 is depicted as a single line, in some embodiments, the digital signal 56 may include multiple data buses running in parallel through the fractal DAC 100. For example, the multiple data buses may include data for multiple phases and/or polarity (e.g., negative and positive). As such, the fractal DAC 100 and the decision units 106 may operate using multiple digital signals 56 in parallel to control outputs of the unit cells 102.

Figure 7:
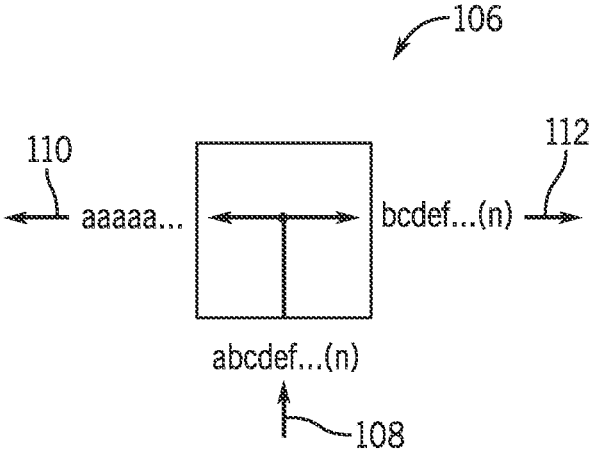
FIG. 7 is a schematic diagram of a decision unit of the fractal digital-to-analog converter of FIG. 6, in accordance with an embodiment of the present disclosure.

To help illustrate, FIG. 7 is an example decision unit 106 receiving an incoming signal 108 of n bits, according to an embodiment of the present disclosure. In some embodiments, the incoming signal 108 (e.g., the digital signal 56) is a binary signal that is decoded step-by-step by the sequential decision units 106, such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the thermometric digital signal (e.g., with logical "1" or high going to two unit cells 102 for activation and logical "0" or low going to two different unit cells 102 for deactivation). For example, the incoming signal 108 may have n-bits (e.g., abcdef . . . n, where each letter is representative of a logical value in a binary format, as in the illustrated example). Each decision unit 106 may take the most significant bit (MSb) of the incoming signal 108, repeat it n–1 times, and output a MSb signal 110 having the MSb of the incoming signal 108 repeated n–1 times. Additionally, the decision unit 106 may output a least significant bit (LSb) signal 112 including the remainder of the incoming signal 108, without the MSb, having n–1 total bits.

As should be appreciated, the MSb of a binary signal is representative of half of the value of the incoming signal 108. As such, if the MSb (e.g., at decision unit 106A) is a logical "1", the repeated logical "1" will be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth. Furthermore, while depicted as outputting the MSb signal 110 to the left and the LSb signal 112 to the right, decision units 106 may output the LSb signal 112 and MSb signal 110 in either direction according to a fill order (e.g., an order increasing activations of unit cells 102) of the fractal DAC 100, which may be programmable. Moreover, in some embodiments, a remainder bit may be added to the digital signal 56 prior to the fractal DAC 100 or added to the MSb signal 110 and/or LSb signal 112 at the first decision unit 106 (e.g., decision unit 106A) based on the digital signal 56 to facilitate decoding from a binary digital signal to a thermometric digital signal (e.g., at the unit cells 102).

Additionally, although depicted in FIGS. 6 and 7 as having two outputs (e.g., MSb signal 110 and LSb signal 112), in some embodiments, the decision units 106 may evaluate multiple bits of the incoming signal 108 at the same time (e.g., simultaneously or concurrently). For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n–2, a signal of repeated entries of the second MSb with a bit depth of n–2, and the LSb signal 112 with a bit depth of n–2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108.

As discussed above, the fractal DAC 100 may facilitate decoding of the digital signal 56 (e.g., via the decision units 106) into a thermometric signal dispersed among the unit cells 102. Additionally or alternatively, the digital signal 56 may include a binary signal that is not decoded via the decision units 106. For example, some unit cells 102 may have a binary-sized output that is dependent upon a binary signal. In some embodiments, the binary signal (e.g., a portion of or separate from the digital signal 56) may traverse the same path as the decoded thermometric signal and therefore have substantially similar arrival time at the binary coded unit cells 102, maintaining synchronicity of the fractal DAC 100. For example, the binary signal may be passed through or bypass the decision units 106 and/or use separate distribution logic following the data path of the fractal DAC 100. The binary coded unit cells 102 may use the binary signal to vary the output between zero (e.g., disabled) and a full unit voltage or current (e.g., 0.0, 0.25, 0.5, 0.75, or 1.0 of a unit voltage or current). For example, the binary coded unit cell 102 may include binary interpretation logic to decode the binary signal and enable the binary coded unit cell 102 at an intermediate power level (e.g., 0.25, 0.5, or 0.75 of a unit voltage or current). The binary-sized output of the binary coded unit cells 102 may facilitate increasing resolution of the analog output signal 64 by providing increased granularity.

Figure 8:
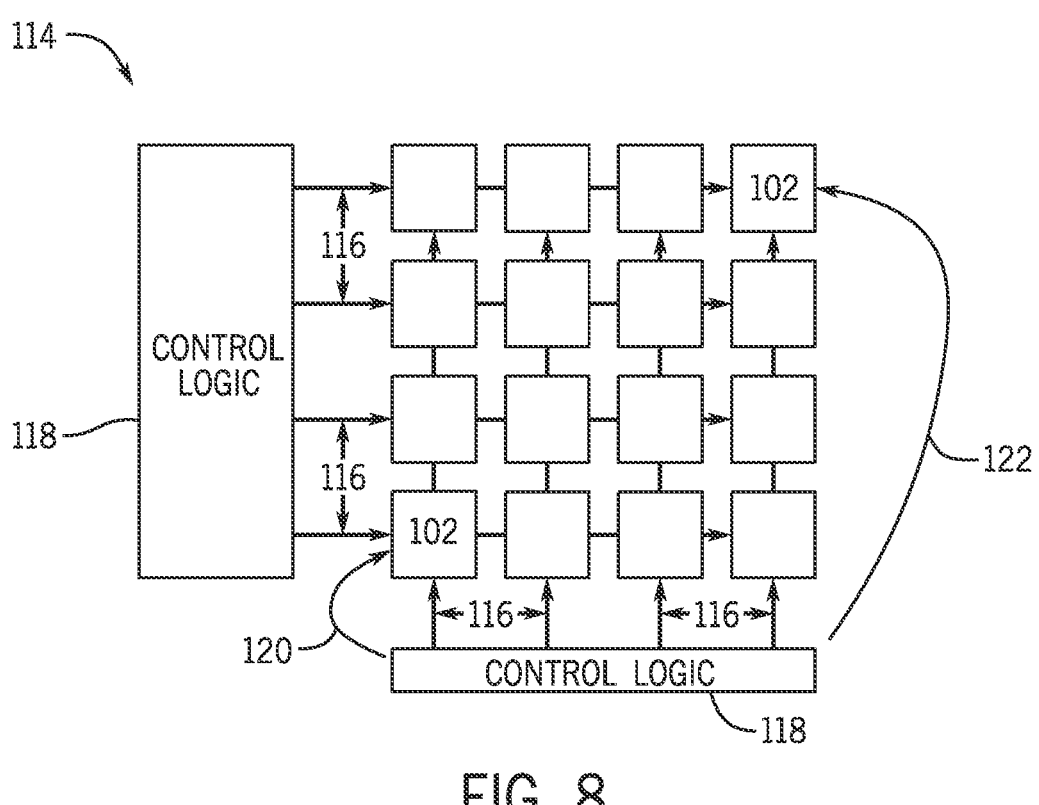
FIG. 8 is a schematic diagram of a column and line digital-to-analog converter, in accordance with an embodiment of the present disclosure.

The fractal DAC 100 may provide increased benefits (e.g., increased speed, increased linearity, decreased DNL, and/or decreased INL) over other forms of DACs such as a column and line DAC 114, as shown in FIG. 8. In some scenarios, the column and line DAC 114 may include a multitude of control signals 116 from control logic 118 feeding an array of unit cells 102. Moreover, while the control logic 118 of the column and line DAC 114 may be non-uniform and have more complex control signals 116, the fractal DAC 100, as discussed herein, may include repeated or reproduced decision units 106 with simplified outputs (e.g., the MSb signal 110 and the LSb signal 112). For example, the control logic 118 of the column and line DAC 114 may incorporate binary to thermometric conversion and/or take into consideration the desired states of multiple individual unit cells 102 concurrently or simultaneously to determine control signals 116 necessary for operation. On the other hand, the simplified decision units 106 may operate faster than control logic 118 of a column and line DAC 114 due to the simplified set of inputs and outputs. Furthermore, the linear nature of the data lines and decision units 106 of a fractal DAC 100 may result in fewer errors and/or less effect when errors, such as mistaken logical values, occur. Additionally, in some embodiments, each decision unit 106 of a fractal DAC 100 may have substantially the same components and/or dimensions, simplifying manufacturing. Moreover, one or more decision units 106 may be implemented while reducing or eliminating gate logic to further increase operating speed.

In some scenarios, the location of the decision units 106 within the array of unit cells 102 may increase the size the array. However, due at least in part to the reduced complexity of the control circuitry (e.g., the decision units 106 compared to the control logic 118), the internalization of the decision units 106 with the array of unit cells 102 may result in an overall smaller DAC 40 by reducing or eliminating control logic 118 exterior to the array of unit cells 102.

In addition to providing a simplified manufacturing process, simplified operation, decreased size, and/or increased speed of operation, the fractal DAC 100 may include data paths (physically and/or logically) to each unit cell 102 that are substantially of the same dimensions, components, and/or number of components, which may further increase linearity and/or synchronicity. For example, returning briefly to FIG. 6, starting from the incoming digital signal 56 and the first decision unit 106A, the data path to each unit cell 102 and the number of decision units 106 traversed along the data path is the same for each unit cell 102. As should be appreciated, in some embodiments, some data paths of a fractal DAC 100 may differ due to manufacturing tolerances, physical layout constraints, data-line-to-data-line coupling, and/or additional implementation factors and interference.

On the contrary, other DACs, such as the column and line DAC 114 depicted in FIG. 8, may have unequal paths—shorter paths (e.g., data path 120) and longer paths (e.g., data path 122). In some scenarios, the disparate physical lengths and/or disparate logical circuitry traversed in a column and line DAC 114 may result in the column and line DAC 114 waiting until a specified time to allow for the control signals 116 to traverse the longer paths (e.g., data path 122). However, a fractal DAC 100 may include data paths that are substantially the same, innately providing the decoded incoming signal 108 to each of the unit cells 102 concurrently or at substantially the same time. In other words, the substantially similar data paths of the fractal DAC 100 may reduce or eliminate a wait time associated with the difference between shorter and longer data paths (e.g., the difference between data path 120 and data path 122), further increasing the operable speed of the fractal DAC 100.

Figure 9:
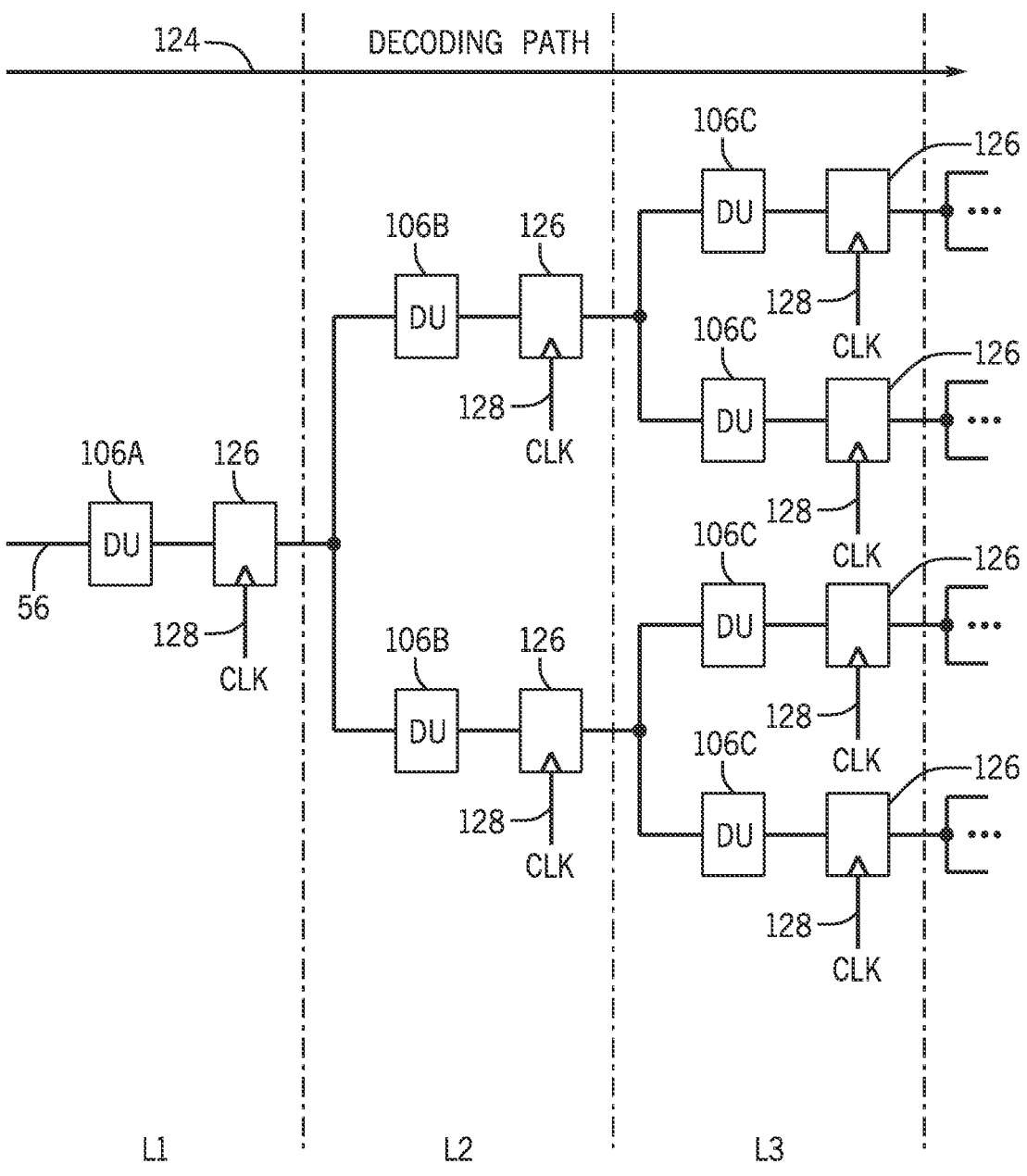
FIG. 9 is an exploded view of a decoding path traversed by the digital signal as it is decoded by the decision units of the fractal digital-to-analog converter of FIG. 6, in accordance with an embodiment of the present disclosure.

As discussed above, the decision units 106 may recursively split the digital signal 56, at each level of decision unit(s) 106, and output an MSb signal 110 and an LSb signal 112 to different branches of the fractal DAC 100. As used herein, the "level" (L) of a decision unit 106 may refer to how many decision units 106 have been traversed by the digital signal 56. For example, referring back to FIG. 6, decision unit 106A may be considered to be at level one (L1), decision unit 106B may be considered to be at level two (L2), and so on. To help further illustrate, FIG. 9 is an exploded view of a decoding path 124 traversed by the digital signal 56 as it is decoded by the decision units 106 of the fractal DAC 100, according to an embodiment of the present disclosure. As discussed herein, latches 126 may be activated by a clock signal 128 to recapture the digital signal 56 at one or more levels along the decoding path 124. Recapture/synchronization of the digital signal 56 at one or more levels may allow for faster operation of the fractal DAC 100 by maintaining synchronous activation signals (e.g., from the digital signal 56) to the unit cells 102. Such synchronization may also reduce non-linearity of the fractal DAC 100. As should be appreciated, synchronization via latches in lieu of or in addition to the fractal layout of the fractal DAC 100 may provide the ability to operate at high frequency (e.g., greater than or equal to 1 GHz, greater than or equal to 5 GHz, greater than or equal to 10 GHz, and so on) with improved efficiency and/or efficacy.

In some embodiments, each level of the decoding path 124 may include latches 126 for each bit of the digital signal 56. However, as shown in FIG. 9, the number of latches 126 increases (e.g., exponentially) at each level due to the splitting of the decoding path 124 via the decision units 106. Moreover, while illustrated as a single latch 126 for level one and two latches 126 for level two, as should be appreciated, each level may include latches 126 for each bit of the digital signal 56 available at that level (e.g., n bits for level one, n−1 bits for level two, and so on). Moreover, additional latches 126 may be utilized at each level for remainder bit(s) or other bits of information, if utilized. As such, depending on the number of levels (e.g., corresponding to the size of the fractal DAC 100), utilizing latches 126 at each level may introduce a significant number of latches 126 to the fractal DAC 100, which may result in significant power consumption. Depending on implementation, such power consumption may or may not be desirable, feasible, and/or worth trading for the synchronization at each level. Moreover, due at least in part to the equal data path lengths and innate properties of the fractal layout, implementing latches 126 at each level may be unnecessary, depending on implementation (e.g., operating frequency, size of the fractal DAC 100, etc.). As such, in some embodiments, latches 126 may be implemented at only a portion of the levels (i.e., less than all of the levels) of the decoding path 124. As should be appreciated, which level(s) are synchronized via latches 126 may depend on implementation (e.g., number of total levels of the fractal DAC 100, desired operating speed, desired synchronicity of unit cell activation, etc.).

Figures 10, 11, 12:
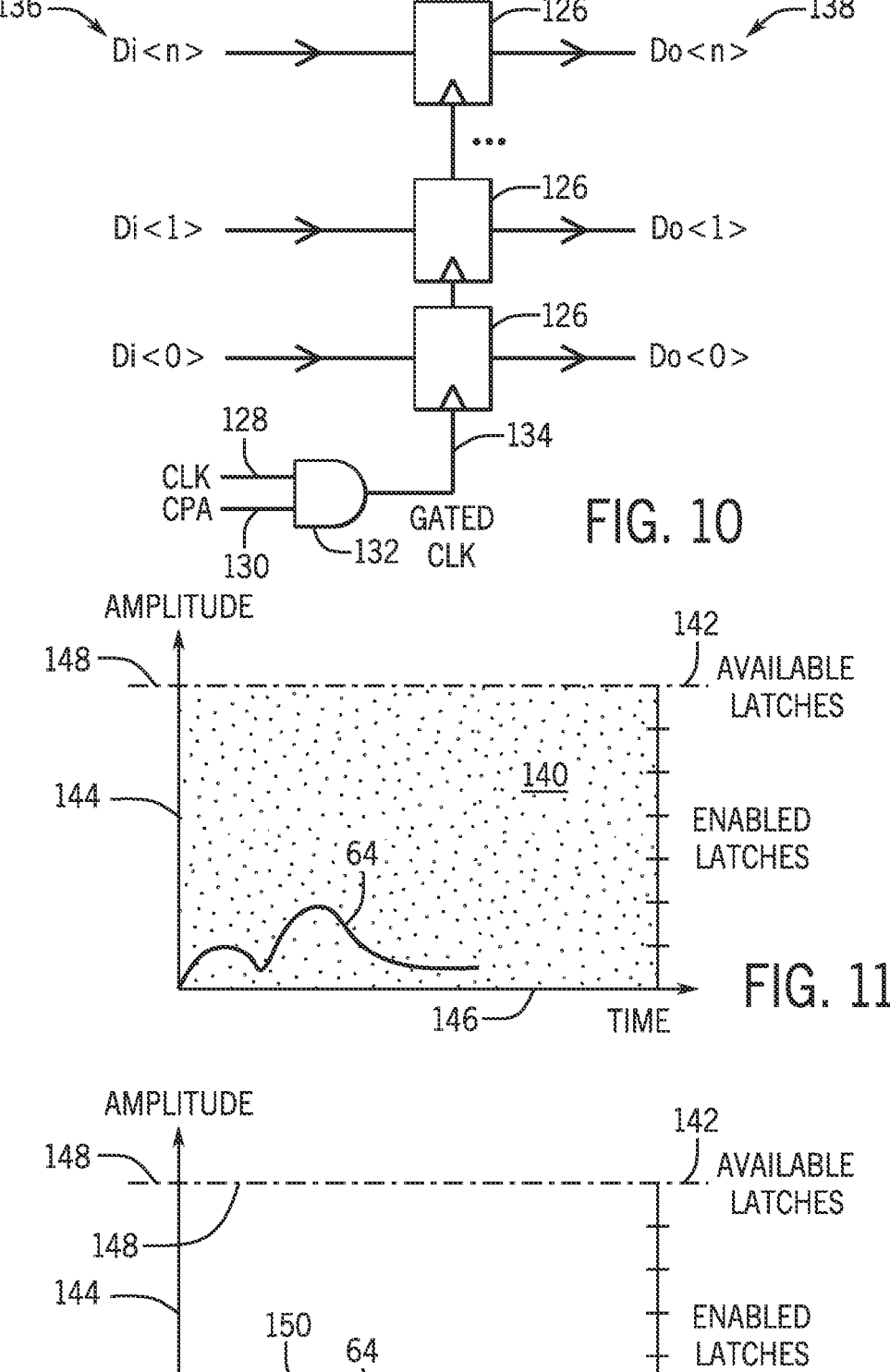
FIG. 10 is schematic diagram of latches gated by a clock signal and a clock path activation signal, in accordance with an embodiment of the present disclosure.
FIG. 11 is a plot of enabled latches with relation to an amplitude of an analog output signal over time without clock tracking, in accordance with an embodiment of the present disclosure.
FIG. 12 is a plot of the enabled latches with relation to the amplitude of an analog output signal over time with static clock tracking, in accordance with an embodiment of the present disclosure.

However, even when utilizing latches 126 at less than all of the levels, depending on implementation and the level(s) chosen for data recapture, power consumption associated with activating the latches 126 may, nevertheless, be greater than desired. As such, in some embodiments, the clock signal 128 may be gated by a clocked path activation (CPA) signal 130, for example at a AND gate 132 or other logic, to generate a gated clock signal 134, as shown in FIG. 10. The gated clock signal 134 may activate latches 126 for the individual input bits 136 of the digital signal 56 at a latched level of the decoding path 124 based on the CPA signal 130. When enabled by the CPA signal 130, the gated clock signal 134 enables the input bits 136 to be recaptured according to the clock signal 128 such that the latches 126 output synchronized output bits 138.

As should be appreciated, the clock signal 128 and/or the CPA signal 130 may or may not follow the same routing (i.e., path layout) as the digital signal 56 through the fractal DAC 100. Additionally, in some embodiments, the clock signal 128 may also control activation of the decision unit(s) 106 at the same level of the latches 126. Further, in some embodiments, the latches 126 may be separate from, combined with, or implemented within the decision unit(s) 106 of the implemented level. Moreover, a disabled CPA signal 130 (and therefore disabled gated clock signal 134) may also disable the associated decision unit(s) 106 and/or circuitry along the remainder of the data path, further reducing power consumption.

Without clock tracking or if clock tracking is disabled, the number of enabled latches 140 may include all of the available latches 142 regardless of the amplitude 144 (e.g., voltage amplitude or current amplitude) of the desired analog output signal 64 over time 146, as shown in FIG. 11. However, by gating the clock signal 128 via the CPA signal 130, the number of enabled latches 140 may be reduced, leading to power savings. As such, as discussed herein, one or more clock tracking techniques may be utilized to assist in reducing the number of enabled latches 140. Moreover, embodiments may include circuitry for one or multiple different clock tracking techniques. For example, depending on implementation, the electronic device 10 may determine whether or not to utilize clock tracking and, if so, which clock tracking technique to use if multiple are available.

In some embodiments, static clock tracking may be implemented (e.g., via static clock tracking circuitry) to reduce the enabled latches 140 to a static amount (e.g., corresponding to a static maximum 147) at or above that which would enable the analog output signal 64, as shown in FIG. 12. Static tracking may make use of known properties of the digital signal 56, the analog output signal 64, and/or operational parameters of the electronic device 10 or fractal DAC 100 to determine a static maximum 147, to which the analog output signal 64 is expected to adhere. For example, in some embodiments, it may be known that the desired analog output signal 64 is backed off from a preset or maximum output amplitude 148 of the fractal DAC 100. Such backing off may be in response to a desired gain level (e.g., for RF transmission), as a property of an RF communication protocol, and/or to remain within regulatory limits.

As such, in some embodiments, the fractal DAC 100 may predetermined the static maximum 147 such that a peak 150 of the analog output signal 64 does not surpass the static maximum 147. As should be appreciated, the static maximum 147 may be determined for a particular operation and/or for a future time period (e.g., 10 seconds, 1 minute, 1 hour, etc.) during use of the fractal DAC 100 and may be recalculated (e.g., via the static clock tracking circuitry) in response to a change in operating mode and/or periodically. Moreover, as should be understood, the peak 150 of the analog output signal 64 over time 146 may or may not reach the static maximum 147. Based on the determined static maximum 147, CPA signals 130 may be generated to allow the gated clock signal 134 to enable latches 126 that could be used (e.g., based on the digital signal 56 and via the unit cells 102) to generate the analog output signal 64 up to the static maximum 147. As such, the number of enabled latches 140 may be decreased, thus saving power and increasing efficiency. As should be appreciated, the static clock tracking circuitry may be implemented via one or more processors 12, which may be shared or dedicated, and/or or be implemented via stand-alone circuitry.

Additionally or alternatively, the static maximum 147 may be determined based on a statistical analysis of the digital signal 56 over a period of time (e.g., the previous 10 seconds, the previous 1 minute, the previous 1 hour, the previous 1 day, etc.). For example, the static clock tracking circuitry may set the static maximum 147 based a statistical determination (e.g., with greater than or equal to a 75% confidence interval, greater than or equal to a 90% confidence interval, greater than or equal to a 95% confidence interval, or any other suitable confidence interval depending on implementation) that the digital signal 56 and the corresponding analog output signal 64 are unlikely to rise above the static maximum 147.

Figures 13, 14:
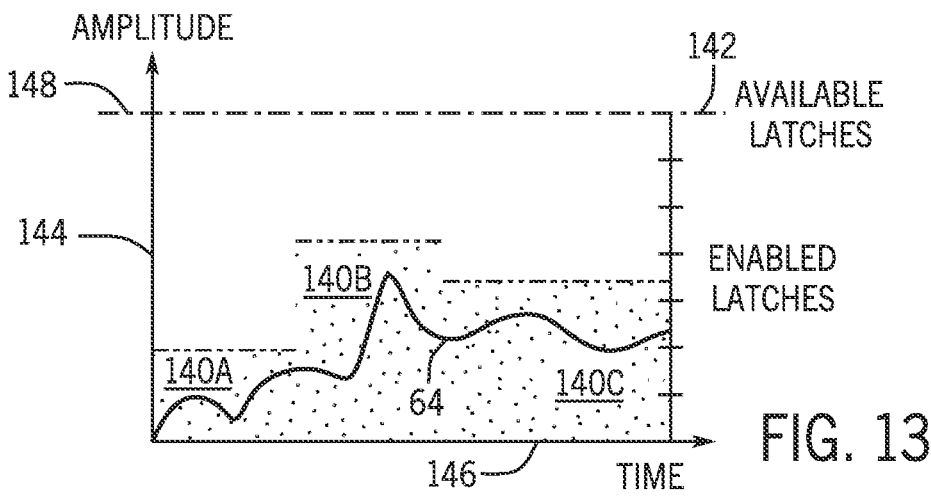
FIG. 13 is a plot of the enabled latches with relation to the amplitude of an analog output signal over time with dynamic clock tracking, in accordance with an embodiment of the present disclosure.
FIG. 14 is a schematic diagram of example dynamic clock tracking circuitry, in accordance with an embodiment of the present disclosure.

While utilizing statistical analysis for determining the static maximum 147, static clock tracking may provide delayed dynamic tracking (e.g., updating based on the digital signal 56 over time). However, unexpected spikes or surges in the digital signal 56 may or may not allow for the CPA signal 130 to react and enable some latches 126 for the upcoming digital signal 56, potentially leading to erroneous analog outputs. As such, additionally or alternatively to static clock tracking, dynamic clock tracking may be utilized to "look ahead" at the incoming digital signal 56 (e.g., operate based on a future digital signal) and enable/disable latches 126 accordingly, as shown in FIG. 13. For example, the first number of enabled latches 140A may increase to a second number of enabled latches 140B as the digital signal 56 (and desired analog output signal 64) increases and decrease to a third number of enabled latches 140C as the digital signal 56 (and desired analog output signal 64) decreases.

FIG. 14 is a schematic diagram of example dynamic clock tracking circuitry 152 that provides CPA signals 130 to at least one level of latches 126, according to an embodiment of the present disclosure. In some embodiments, the dynamic clock tracking circuitry 152 utilizes delay latches 154 to provide a present (e.g., current) digital signal 56A to the fractal DAC 100 with the corresponding CPA signals 130, while operating on a future digital signal 56B to generate the next set of CPA signals 130. As should be appreciated, depending on what level (L) of the decoding path 124 the dynamic clock tracking circuitry 152 is associated with, the number of output CPA signals 130 may vary. For example, with reference to FIG. 9, two CPA signals 130 may be generated for L2, one for each branch of the decoding path, and four CPA signals 130 may be generated for L3. To generate the CPA signals 130, the dynamic clock tracking circuitry 152 may utilize at least a portion of the future digital signal 56B to generate a future CPA signal 156 via a normalized binary to thermometric converter 158. The normalized binary to thermometric converter 158 may include any suitable circuitry/logic and/or be implemented in software via a processor 12 to convert at least a portion of the future digital signal 56B from a binary format to a thermometric/thermometer format. Moreover, depending on the level of the decoding path 124, which bits of the digital signal 56 are utilized may vary. For example, for L2, the most significant bit (MSB) of the future digital signal 56B may be utilized to generate two bits of the future CPA signal 156. For L3, the two MSB s of the future digital signal 56B may be utilized to generate four bits of the future CPA signal 156. As should be appreciated, the future CPA signal 156 is normalized (e.g., via the normalized binary to thermometric converter 158) such that when the MSBs of the future digital signal 56B are all logically low (e.g., zero) the future CPA signal 156 maintains a single logically high bit. Moreover, although shown as not utilizing the least significant bits (LSBs), as should be appreciated, when implemented at different levels, some or all of the LSBs may be used.

Figure 15:
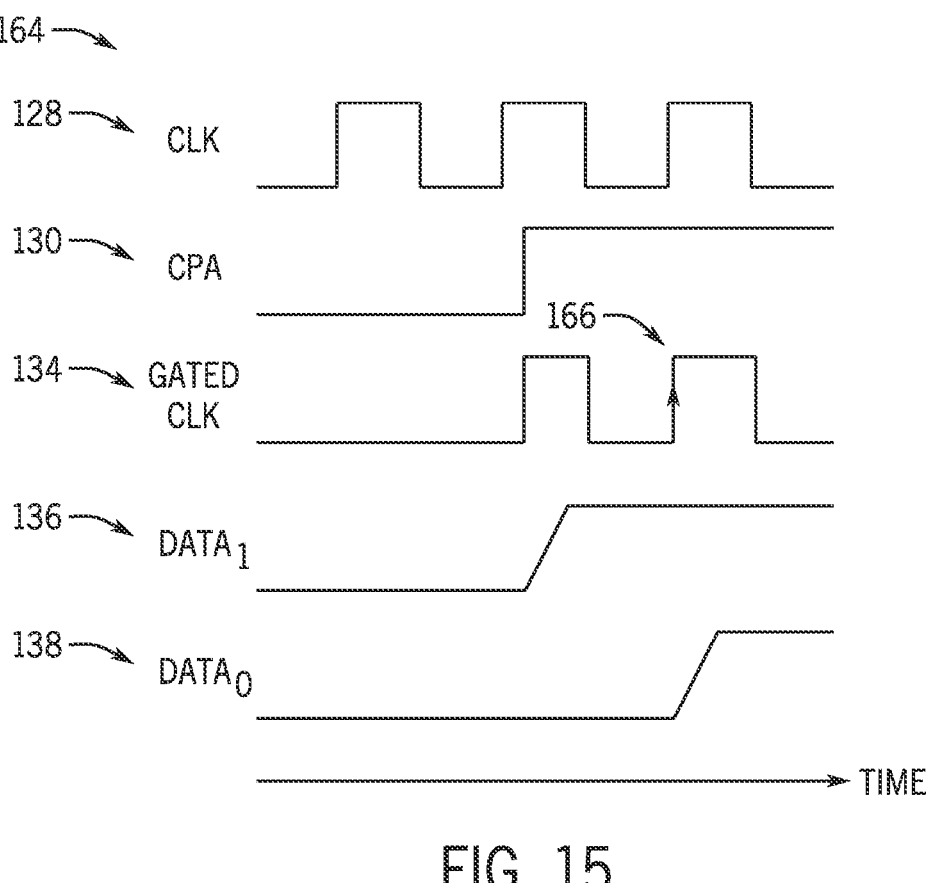
FIG. 15 is a timing diagram of the dynamic clock tracking circuitry of FIG. 14, in accordance with an embodiment of the present disclosure.

Additionally, the delay latches 154 may be used to distinguish the future CPA signal 156 from the present CPA signal 160. In general, the present CPA signal 160 may represent activation of the latches 126 associated with activated input bits 136 of the present digital signal 56A, and the future CPA signal 156 may represent activation of the latches 126 associated with activated input bits 136 of the future digital signal 56B. In some embodiments, the future CPA signal 156 and the present CPA signal 160 may be used together (e.g., via an OR gate 162) to generate the CPA signal 130 output to the fractal DAC 100. By utilizing the future CPA signal 156 to generate the CPA signal 130, the clocked edge 166 (e.g., the rising edge) of the gated clock signal 134 is available for activation of the output bit 138 according to the input bit 136, as shown in the timing diagram 164 of FIG. 15. Moreover, by utilizing the present CPA signal 160, the gated clock signal 134 is maintained for the present digital signal 56A even if the future digital signal 56B is inactive (e.g., includes logically low data). In other words, if either the present CPA signal or the future CPA signal are activated for a branch of the decoding path 124 at the designated level, the CPA signal 130 for that branch is activated such that latches 126 may be enabled for the present and future digital signals 56 and deactivated otherwise. As such, the dynamic clock tracking circuitry 152 may deactivate latches 126 that do not have active digital signals 56 actively (e.g., within the present or future clock cycles) passing therethrough, thereby saving power and increasing efficiency. Furthermore, additional delay latches 154 may be used in series to "look ahead" by additional clock cycles, depending on implementation.

While the dynamic clock tracking circuitry 152 provides power savings by deactivating latches 126 that do not have active (e.g., logically high) portions (e.g., bits) of a digital signal 56 passing therethrough, in some scenarios, one or more subsequent digital signals 56 may be similar (e.g., have similar values) and, therefore, utilize much of the same unit cells 102 and latches 126. In other words, the input bits 136 to a latch 126 may be the same or similar for multiple sets of data over multiple clock cycles. As should be appreciated, if an input bit 136 does not change (e.g., over a clock cycle), the output bit 138 is not desired to change regardless of whether the latch 126 is to be activated via the gated clock signal 134. As such, differential clock tracking may be utilized to enable latches 126 that may have changes to their input bits 136 between the present digital signal 56A and the future digital signal 56B, while latches 126 with input bits 136 that do not change may be deactivated and/or be placed into a transparency mode. For example, in some embodiments, the latches 126 (e.g., implemented as tri-state/multistate latches) may include a transparency mode that allows a latch 126 to function as a transparent buffer such that the previous value of the digital signal 56 is maintained without triggering the latch 126 via the gated clock signal 134.

Figure 16:
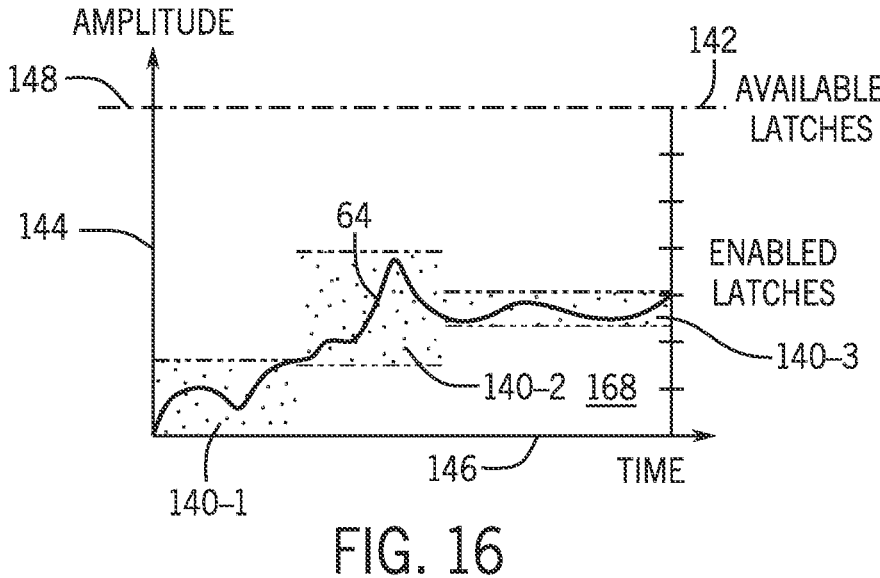
FIG. 16 is a plot of the enabled latches with relation to the amplitude of an analog output signal over time with differential clock tracking, in accordance with an embodiment of the present disclosure.

To help further illustrate, FIG. 16 is a plot of enabled latches 140 with relation to the amplitude 144 of the analog output signal 64 over time 146 using differential clock tracking. In the example plot, as the analog output signal 64 varies in time 146, the number of differentially enabled latches 140-1, 140-2, and 140-3 varies according to the variation in the analog output signal 64, which corresponds to the variation in the digital signal 56. Indeed, while certain latches 126 (e.g., at 168 of FIG. 16) have logically high output bits 138, due to the lack of deviation in the digital signal 56, the gated clock signal 134 to such latches 126 may be deactivated such that clock edge triggering of the latches 126 does not occur, thereby saving power and increasing efficiency.

In some embodiments, the transparency mode of the latches 126 may be engaged via a transparency mode signal (e.g., received at the latches 126). The transparency mode signal may switch the mode of operation of the latches 126 from being clock edge triggered (e.g., via the gated clock signal 134) to that of a transparent latch that passes through the holdover data (e.g., bits) from the previous digital signal 56 that are also be used for the subsequent digital signal 56. By maintaining the same output bits 138, power may be saved by omitting the triggering of the latches 126, thus, increasing efficiency.

Figure 17:
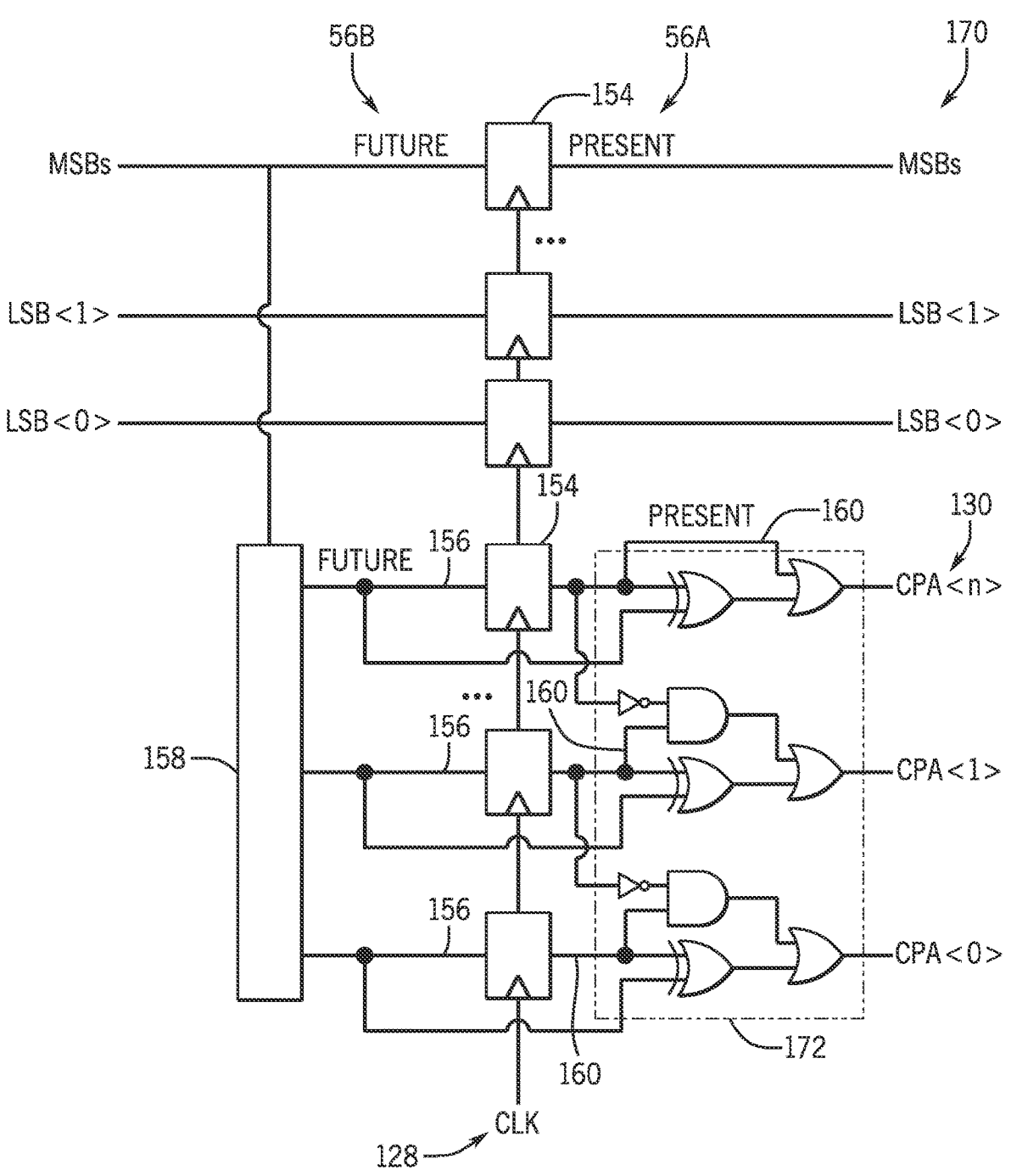
FIG. 17 is a schematic diagram of example differential clock tracking circuitry, in accordance with an embodiment of the present disclosure.

FIG. 17 is a schematic diagram of example differential clock tracking circuitry 170 that provides CPA signals 130 to at least one level of latches 126, according to an embodiment of the present disclosure. In a similar manner as the dynamic clock tracking circuitry 152, the differential clock tracking circuitry 170 may utilize delay registers 154 and a normalized binary to thermometric converter 158 to distinguish the present digital signal 56A, the future digital signal 56B, the present CPA signal 160, and the future CPA signal 156. Additionally, in some embodiments, the differential clock tracking circuitry 170 may include differential circuitry 172 to determine (e.g., based on the present CPA signal 160 and the future CPA signal 156) which branches of latches 126 will have changing input bits 136 from the present digital signal 56A to the future digital signal 56B. As such, latches 126 that have unchanging input bits 136 as well as latches 126 having inactive (e.g., logically low) input bits 136 may be deactivated, thus saving power and increasing efficiency. Further, the differential circuitry 172 may include additional circuitry to generate the transparency mode signal based on the digital signal 56, the clock signal 128, and/or the CPA signal 130. As should be appreciated, the logic depicted for the differential circuitry 172 is shown as an example and is, as such, non-limiting. Moreover, the dynamic clock tracking circuitry 152 of FIG. 14 and the differential clock tracking circuitry 170 of FIG. 17 are given as examples of clock tracking circuitry for latching at some level along the decoding path 124, and additional circuitry may be added or removed depending on implementation. For example, the dynamic clock tracking circuitry 152 and differential clock tracking circuitry 170 may be implemented via one or more processors 12, which may be shared or dedicated, and/or or be implemented via stand-alone circuitry similar to or different from the examples of FIGS. 14 and 17.

As should be appreciated, while the different clock tracking techniques (e.g., static, dynamic, differential, or no clock tracking) may correlate to different amounts of power savings, increased complexity and/or noise from enabling/disabling the latches 126 of certain techniques/circuitry may be undesirable. However, as discussed herein, the clock tracking techniques and circuitry components may be implemented individually, together, or may be selectable. For example, the fractal DAC 100 may be implemented with different clock tracking techniques at different levels of the decoding path 124, the same clock tracking technique at multiple different levels of the decoding path 124, or a single clock tracking technique at a single level of the decoding path 124. Furthermore, in some embodiments, the fractal DAC 100 may select a clock tracking technique (e.g., static, dynamic, differential, or no clock tracking) to implement at a particular or selectable level of the decoding path 124. For example, data statistics, a key performance indicator, or an operating mode of the electronic device 10 or the fractal DAC 100 may be used to select which clock tracking technique to implement. As such, the fractal DAC 100 may be manufactured with a particular clock tracking technique implementation or multiple clock tracking technique implementations that are selectable during operation depending on implementation.

FIG. 18 is a flowchart of a method 180 of an example process for utilizing clock tracking, according to an embodiment of the present disclosure. It should be understood that the following process blocks may be performed in the order described below, or in alternative orders. In some embodiments, one or more of the process blocks may be skipped altogether. Processing circuitry (e.g., processor 12) of the electronic device 10 may receive a digital signal 56 to be converted to an analog output signal 64 (process block 190), and determine which clock tracking technique (e.g., static, dynamic, differential, or no clock tracking) is desired (process block 200). As should be appreciated, for implementations having only one clock tracking technique (e.g., static, dynamic, or differential clock tracking), the electronic device 10 may determine whether or not to utilize clock tracking. Based on the selected clock tracking technique, the processing circuitry may enable the corresponding clock tracking circuitry (e.g., static clock tracking circuitry, dynamic clock tracking circuitry 152, or the differential clock tracking circuitry 170) (process block 210). The enabled clock tracking circuitry may then determine the CPA signal based on the digital signal 56 (process block 220), and enable the latches 126 (e.g., via the gated clock signal 134) based on the CPA signal (process block 230).

As discussed above, by providing one or more techniques for clock tracking (e.g., static clock tracking, dynamic clock tracking, and/or the differential clock tracking), the fractal DAC 100 may incorporate latches 126 at one or more desired levels of the decoding path 124 to increase synchronicity and/or linearity while reducing the power consumption of such latches 126. Additionally, while discussed above in regard to the fractal DAC 100, as should be appreciated, the latches 126 and clock tracking techniques described herein may also be applicable to other DACs such as the column and line DAC 114. For example, latches 126 may be implemented to synchronize the control signals 116 after the control logic 118 and/or at the unit cells 102, and the clock tracking techniques discussed herein may be used to reduce the power consumption of such latches 126. Moreover, although the above referenced flowchart is shown in a given order, in certain embodiments, process blocks may be reordered, altered, deleted, and/or occur simultaneously. Additionally, the referenced flowchart is given as illustrative tool and further decision and process blocks may also be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A digital-to-analog converter (DAC) comprising:
   a unit cell array comprising a plurality of unit cells, wherein each unit cell of the plurality of unit cells is configured to output a unit amount of power in response to activation such that an aggregate output of activated unit cells of the plurality of unit cells forms, at least in part, an analog output of the DAC;
   a branching data path coupled to the plurality of unit cells; and
   a plurality of latches disposed on a plurality of branches of a level of the branching data path, wherein the plurality of latches are configured to latch bits of a digital signal propagated via the branching data path.

2. The DAC of claim 1, comprising clock tracking circuitry configured to generate a clock path activation signal that enables a subset of the plurality of latches based at least in part on the digital signal.

3. The DAC of claim 2, wherein each latch of a branch of the plurality of branches of the level of the branching data path receives a same portion of the clock path activation signal.

4. The DAC of claim 2, wherein the subset of the plurality of latches is less than a total number of latches of the plurality of latches.

5. The DAC of claim 1, wherein the branching data path comprises a plurality of individual data paths to each unit cell of the plurality of unit cells, wherein each individual data path of the plurality of individual data paths has a same length.

6. An electronic device comprising:
   a digital-to-analog converter (DAC) having a plurality of cells and a data path configured to decode and communicate a digital signal to the plurality of cells, the data path comprising a plurality of latches operatively enabled based at least in part on a clock path activation signal; and
   clock tracking circuitry configured to generate the clock path activation signal based at least in part on the digital signal.

7. The electronic device of claim 6, wherein the clock tracking circuitry is configured to distinguish the digital signal from a future digital signal at least one clock cycle removed from the digital signal via a plurality of delay latches, wherein the clock path activation signal is based at least in part on the future digital signal.

8. The electronic device of claim 7, wherein the clock tracking circuitry is configured to generate a future clock path activation signal based at least in part on the future digital signal and to distinguish the future clock path activation signal from a present clock path activation signal via a second plurality of delay latches.

9. The electronic device of claim 8, wherein the clock tracking circuitry comprises an OR gate configured to receive the future clock path activation signal and the present clock path activation signal and to output at least a portion of the clock path activation signal.

10. The electronic device of claim 8, wherein the clock tracking circuitry comprises differential circuitry configured to determine the clock path activation signal based at least in part on the digital signal, wherein the clock path activation signal is configured to enable a subset of the plurality of latches having input bit values that change during the at least one clock cycle between the digital signal and the future digital signal.

11. The electronic device of claim 6, wherein the data path comprises a plurality of decision units configured to decode the digital signal prior to the plurality of cells receiving the digital signal.

12. The electronic device of claim 11, wherein the data path comprises a branching distribution tree disposed in a fractal layout and configured to distribute decoded portions of the digital signal to the plurality of cells.

13. The electronic device of claim 11, wherein the plurality of cells is configured to enable or disable based at least in part on receiving decoded portions of the digital signal to generate an analog output signal corresponding to the digital signal.

14. The electronic device of claim 6, wherein the clock tracking circuitry is configured to generate a static clock path activation signal.

15. The electronic device of claim 14, wherein the static clock path activation signal is based at least in part on a known maximum digital input of the DAC that will be converted over a future time period.

16. A method comprising:
   receiving, at a digital-to-analog converter (DAC), a digital signal corresponding to an analog output of the DAC, wherein the DAC comprises a plurality of cells configured to generate the analog output, wherein each cell of the plurality of cells is configured to output a unit amount of power in response to activation such that an aggregate output of activated cells of the plurality of unit cells forms, at least in part, the analog output;
   determining, via clock tracking circuitry, a clock path activation signal based at least in part on the digital signal; and
   enabling one or more latches of the DAC based at least in part on the clock path activation signal, wherein the one or more latches are configured to latch at least a portion of the digital signal along a data path to the plurality of cells.

17. The method of claim 16, comprising selecting a clock tracking technique, from a plurality of clock tracking techniques, based at least in part on the digital signal, a mode of operation, or both, wherein the clock path activation signal is based at least in part on the clock tracking technique.

18. The method of claim 17, wherein the plurality of clock tracking techniques comprise at least two of: static clock tracking, dynamic clock tracking, differential clock tracking, or disabled clock tracking.

19. The method of claim 16, comprising decoding, via a plurality of decision units disposed along the data path, the digital signal, wherein the portion of the digital signal comprises a partially decoded portion of the digital signal.

20. The method of claim 16, wherein the DAC comprises a fractal DAC configured in a fractal pattern.

* * * * *